United States Patent
Ochoa et al.

(10) Patent No.: US 6,347,394 B1
(45) Date of Patent: Feb. 12, 2002

(54) BUFFERING CIRCUIT EMBEDDED IN AN INTEGRATED CIRCUIT DEVICE MODULE USED FOR BUFFERING CLOCKS AND OTHER INPUT SIGNALS

(75) Inventors: Roland Ochoa; Joe Olson, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/185,880

(22) Filed: Nov. 4, 1998

(51) Int. Cl.[7] .............................. G06F 17/50; G06F 7/38
(52) U.S. Cl. .............................. 716/6; 716/16; 326/37; 326/41; 326/47; 326/39; 365/189.08
(58) Field of Search .............................. 365/52, 189.08; 327/276; 716/6, 16; 326/37–41, 47

(56) References Cited

U.S. PATENT DOCUMENTS

| | | | |
|---|---|---|---|
| 5,226,008 A | | 7/1993 | Aono |
| 5,515,514 A | | 5/1996 | Dhuey et al. |
| 5,532,954 A | * | 7/1996 | Bechtolsheim et al. ........ 365/52 |
| 5,539,349 A | * | 7/1996 | Roy ........................... 327/276 |
| 5,557,779 A | * | 9/1996 | Minami ........................ 716/6 |
| 5,566,127 A | | 10/1996 | Hoshizaki |
| 5,572,482 A | | 11/1996 | Hoshizaki et al. |
| 5,600,802 A | | 2/1997 | Yazdy et al. |
| 5,602,999 A | | 2/1997 | Hyatt |
| 5,615,355 A | | 3/1997 | Wagner |
| 5,631,866 A | | 5/1997 | Oka et al. |
| 5,666,321 A | | 9/1997 | Schaefer |
| 5,680,342 A | * | 10/1997 | Frankeny ..................... 365/52 |
| 5,812,414 A | * | 9/1998 | Butts et al. ................... 716/16 |
| 5,909,375 A | * | 6/1999 | McClintock et al. .......... 716/6 |

FOREIGN PATENT DOCUMENTS

| | | | | |
|---|---|---|---|---|
| EP | 0 571 099 A1 | | 5/1993 | |
| EP | 0571099 A1 | * | 11/1993 | ........... G06F/13/42 |
| EP | 0744748 A2 | * | 5/1995 | ............ G11C/5/00 |
| EP | 0 744 748 A2 | | 5/1996 | |
| EP | 0840448 A3 | | 10/1997 | |
| EP | 0 840 448 A2 | | 10/1997 | |

OTHER PUBLICATIONS

PCT International Search Report of Feb. 29, 2000.

* cited by examiner

*Primary Examiner*—Matthew Smith
*Assistant Examiner*—Jibreel Speight
(74) *Attorney, Agent, or Firm*—TraskBritt

(57) ABSTRACT

An integrated circuit (IC) module, such as a Single In-Line Memory Module (SIMM), Dual In-Line Memory Module (DIMM), or Multi-Chip Module (MCM), includes a buffering IC that buffers clock and other input signals received by the IC module. As a result of the buffering, the setup and hold times associated with these input signals are improved, thereby improving yields.

13 Claims, 4 Drawing Sheets

BUFFERING CIRCUIT EMBEDDED IN AN INTEGRATED CIRCUIT DEVICE MODULE USED FOR BUFFERING CLOCKS AND OTHER INPUT SIGNALS

BACKGROUND OF THE INVENTION

1. Technical Field

This invention relates in general to integrated circuit (IC) modules, such as multi-chip modules (MCMs), Single In-Line Memory Modules (SIMMs), and Dual In-Line Memory Modules (DIMMs). More specifically, this invention relates to a device and method for buffering clock and other input signals received by IC modules.

2. State of the Art

As shown in FIG. 1, a typical IC module 10 includes a set of IC devices 12 that communicates with external electronic devices (not shown) through a set of input/output (I/O) pins 14. Each of the IC devices 12 has characteristic high and low voltage "trip" points $V_{IH}$ and $V_{IL}$ at which each device 12 will register, respectively, high and low states in an input signal. In addition, each of the IC devices 12 has characteristic minimum "setup" and "hold" times that characterize required minimum timing relationships between certain input signals.

In some instances, amplitude fluctuations during high-to-low or low-to-high transitions in input signals received by the IC module 10 (e.g., clock signals, Row Address Strobe (RAS), Column Address Strobe (CAS), Output Enable (OE), and Write Enable (WE)), in combination with a relatively high trip point $V_{IH}$ or a relatively low trip point $V_{IL}$ in an IC device 12, can cause the IC module 10 to fail during testing as a result of a failure of the device 12 to register a transition in one of these input signals. In other instances, the same fluctuations experienced by an IC device 12 that has a relatively large minimum setup or hold time can vary the timing relationships between certain input signals enough to also cause the IC module 10 to fail during testing. In both instances, the failing IC module 10 is typically repaired or scrapped, thereby reducing the yield and increasing the overall costs associated with manufacturing modules such as the IC module 10.

Accordingly, it would be desirable to have a device and method for IC modules that reduce or eliminate these amplitude fluctuations in input signals provided to the modules in order to improve their yield and reduce manufacturing costs.

SUMMARY OF THE INVENTION

An integrated circuit (IC) module in accordance with this invention includes a module terminal (e.g., an input/output (I/O) pin) that receives a signal (e.g., a clock). A buffering circuit in a buffering IC of the IC module then buffers the signal, and an IC device (e.g., a DRAM) in the IC module then receives and uses the buffered signal. As a result of the buffering, the signal may, for example, be delayed slightly, have improved rise and fall times, and have reduced amplitude fluctuations, all of which may contribute to improved setup and hold times when the buffered signal is received and used by the IC device. The improved setup and hold times may, in turn, lead to improved yields (because more IC modules pass testing) and reduced manufacturing costs.

In other embodiments of this invention, the IC module described above is embodied in a SIMM, a DIMM, an MCM, or an electronic system.

In a further embodiment of this invention, a signal in an IC module is prepared for use by an IC device of the IC module. The signal is initially received at the IC module (e.g., at an I/O pin of the IC module). A buffering circuit in a buffering IC provided in the IC module then buffers the signal, and the buffered signal is then conducted to the IC device for its use.

In still another embodiment, an IC module is manufactured using an IC module substrate that has multiple module terminals (e.g., I/O pins) on its surface. Multiple IC devices are mounted on the surface of the IC module substrate, along with a buffering IC that includes a buffering circuit. The buffering circuit is then electrically interposed between one of the module terminals and one of the IC devices so a signal received at the module terminal is buffered by the buffering circuit before reaching the IC device.

DETAILED DESCRIPTION OF THE ILLUSTRATED EMBODIMENTS

Figure 1:
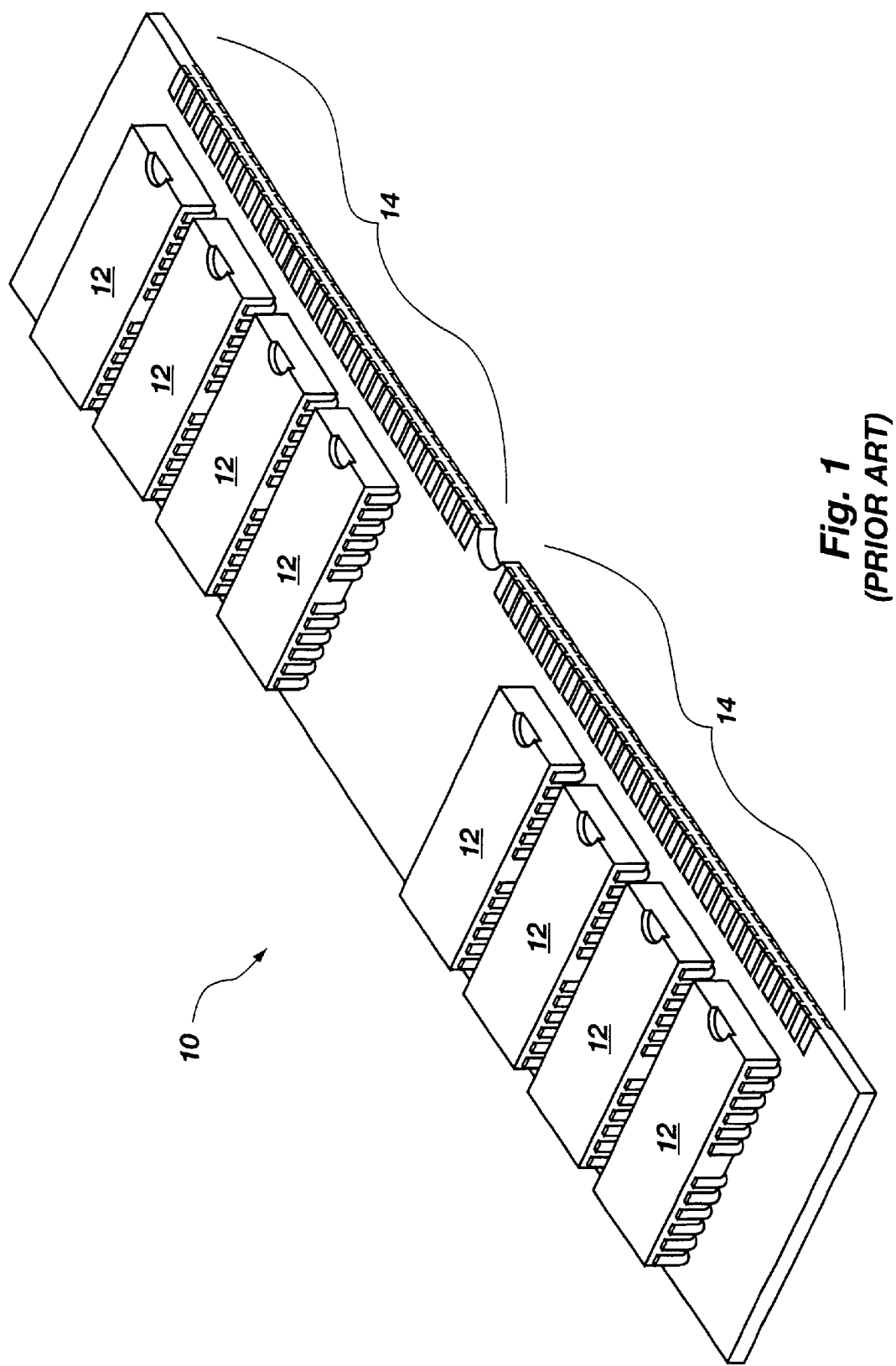
FIG. 1 is an isometric top view of a conventional integrated circuit (IC) module.
Figure 2:
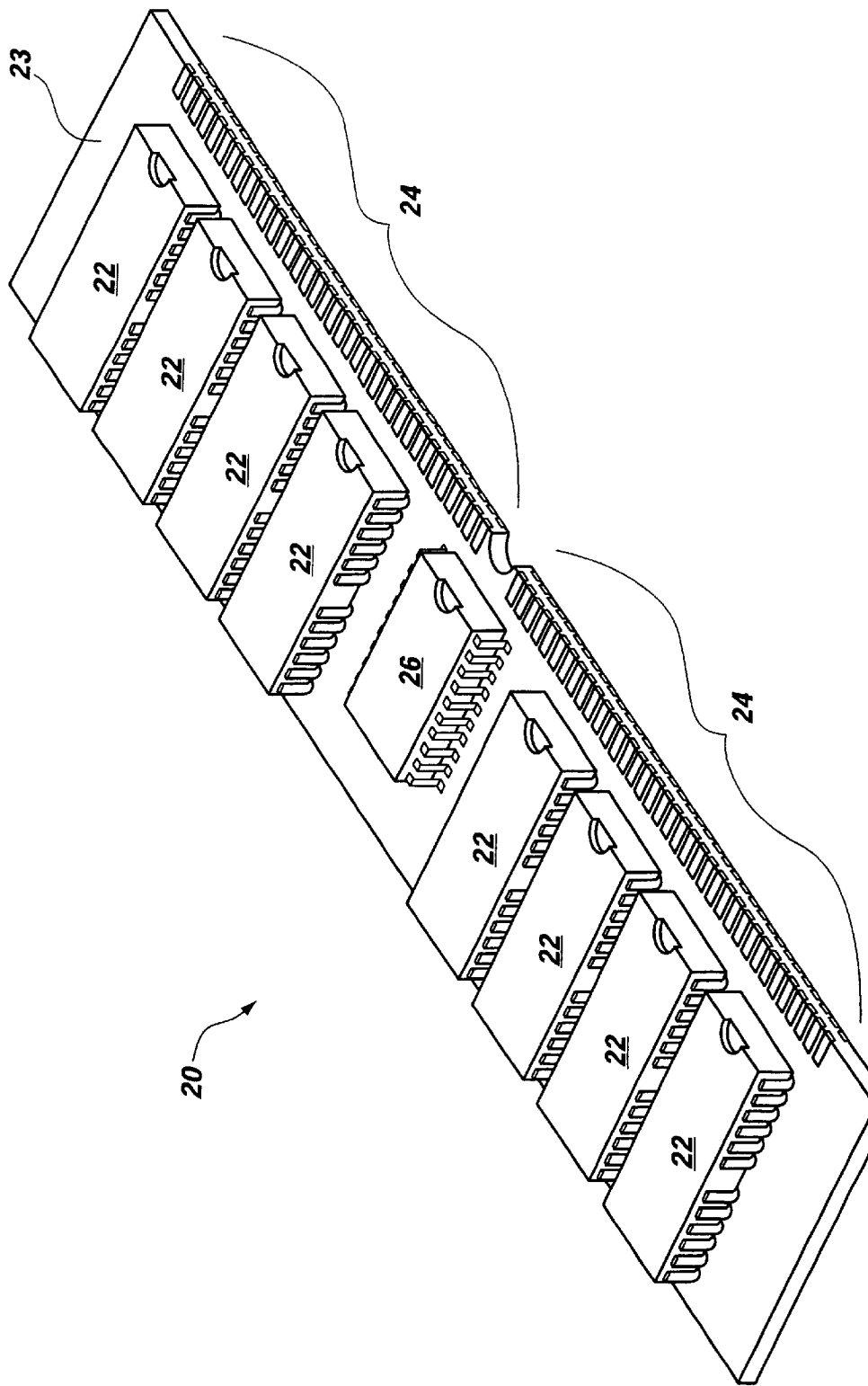
FIG. 2 is an isometric top view of an IC module in accordance with this invention.

As shown in FIG. 2, an integrated circuit (IC) module 20 in accordance with this invention includes a group of IC devices 22 mounted on a module substrate 23 that receive and outputs signals through a set of input/output (I/O) pins 24. It will be understood by those having skill in the technical field of this invention that while the IC module 20 is illustrated in FIG. 2 as comprising a Dual In-Line Memory Module (DIMM), it may, instead, comprise a Single In-Line Memory Module (SIMM), a Multi-Chip Module (MCM), or any other type of IC module. Also, it will be understood that each of the IC devices may comprise any type of IC device including, for example, a Dynamic Random Access Memory (DRAM), a Static RAM (SRAM), a Synchronous DRAM (SDRAM), a Video RAM (VRAM), a Synch-Link DRAM (SLDRAM), or a RAMbus-type DRAM.

A buffering IC 26 is electrically interposed between the IC devices 22 and the I/O pins 24 in order to buffer various input signals (e.g., clock, RAS, CAS, OE, WE, and DQ signals) received at the I/O pins 24 before those signals are conducted to the IC devices 22. It will be understood that the buffering IC 26 may be packaged in a variety of ways, and that this invention is not limited to a buffering IC 26 packaged in the manner illustrated in FIG. 2.

Figure 3:
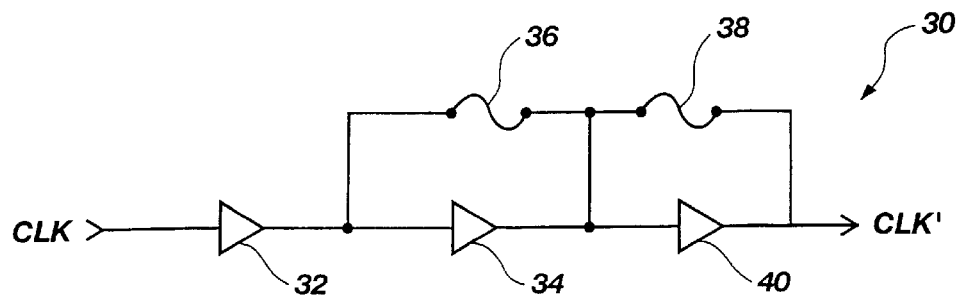
FIG. 3 is a circuit schematic illustrating a buffer circuit of the IC module of FIG. 2.

As shown in FIG. 3, a buffering circuit 30 of the buffering IC 26 (FIG. 2) receives an input clock CLK, buffers the input clock CLK through buffers 32 and 34 as a result of a "jumper" laser fuse 36 having previously been blown during manufacturing of the IC 26, and outputs a buffered clock CLK' through another jumper laser fuse 38 (which has not been blown), thereby bypassing another buffer 40. It will be understood, of course, that the buffering IC 26 (FIG. 2) may contain multiple buffering circuits 30, one for each of a plurality of input signals. It will also be understood that the buffers 32, 34, and 40 may be implemented using a wide variety of circuitry including, for example, a chain of inverters. Further, it will be understood that non-volatile elements other than the jumper laser fuses 36 and 38 may be used in connection with this invention including, for example, zero-ohm resistors, antifuse circuits, and flash EEPROM cells. In addition, it will be understood that while three buffers and two non-volatile elements are illustrated in FIG. 3, the buffering circuit 30 may comprise any number of buffers and non-volatile elements in series, and that these non-volatile elements may be programmed in a wide variety of ways to achieve the buffering desired.

Furthermore, it should be understood that the term "buffering" generally denotes a process by which the rise and/or fall times of the edges of a signal are reduced, amplitude fluctuations in the signal are reduced or eliminated, and/or some delay is introduced into the signal. Of course, other common meanings may be attributed to the term "buffering," and are intended to be included within the scope of this invention.

Figure 4:
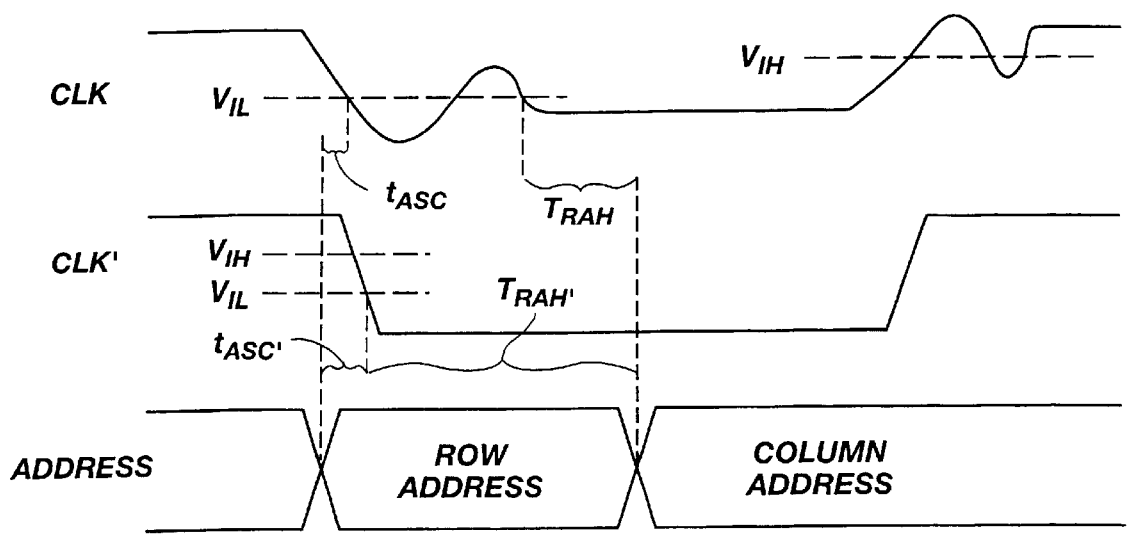
FIG. 4 is a timing diagram illustrating an input clock signal buffered by the buffer circuit of FIG. 3.

As shown in FIG. 4, the unbuffered input clock CLK provides a Row Address to Clock setup time $t_{ASC}$ that may not meet minimum setup time specifications of the IC devices 22 (FIG. 2). In contrast, the delay afforded by buffering the input clock CLK through both of the buffers 32 and 34 (FIG. 3) provides an increased setup time $t_{ASC}'$ that is more likely to meet the minimum setup time specifications of the IC devices 22 (FIG. 2).

Similarly, the unbuffered input clock CLK fluctuates before settling below the trip point $V_{IL}$, and therefore provides a Clock to Row Address hold time $T_{RAH}$ that may not meet minimum hold time specifications of the IC devices 22 (FIG. 2). In contrast, the sharp falling edge provided by the buffered clock CLK' provides a Clock to Row Address hold time $T_{RAH}'$ that is more likely to meet the minimum hold time specifications of the IC devices 22 (FIG. 2).

Of course, it will be understood that the present invention is applicable to any input signal, and is not limited to clock signals. It will also be understood that multiple buffering circuits 30 (FIG. 3) in the buffering IC 26 may be used to provide varying degrees of buffering, as necessary, for multiple input signals by programming the non-volatile elements in the individual buffering circuit 30 associated with each such signal.

Figure 5:
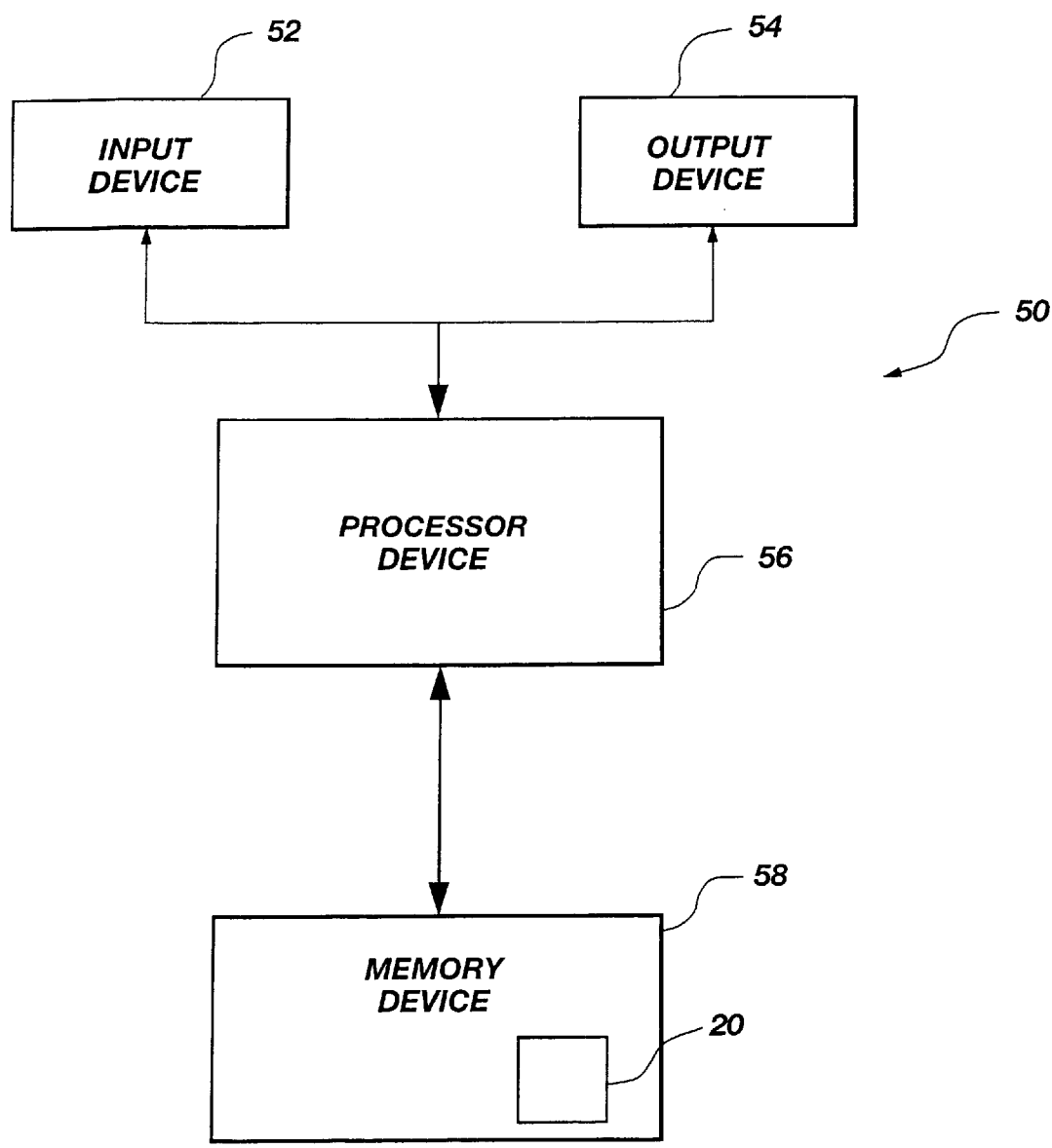
FIG. 5 is a block diagram illustrating an electronic system incorporating the IC module of FIG. 2.

As shown in FIG. 5, an electronic system 50 of this invention includes an input device 52, an output device 54, a processor device 56, and a memory device 58 that incorporates the IC module 20 of FIG. 2. It will be understood, of course, that any one of the input, output, and processor devices 52, 54, and 56 may also incorporate the IC module 20 of FIG. 2.

The input device 52 may be, for example, a keyboard, a mouse, a trackball, a touch pad, a transducer, a musical instrument, or any other input device. The output device 54 may be, for example, a display screen or monitor, a television screen, a printer, a speaker, a musical instrument, a transducer, an actuator, or any other output device. Also, the processor device 56 may be, for example, any conventional general purpose single- or multi-chip microprocessor such as a Pentium® processor, a Pentium® Pro processor, a Pentium® II processor, an 8051 processor, a MIPS® processor, a Power PC® processor, an ALPHA® processor, or any of the AMD® or Cyrix® lines of processors. In addition, the processor device 56 may be, for example, any conventional special purpose microprocessor such as a digital signal processor or a graphics processor.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. An integrated circuit (IC) module comprising:

a module terminal for receiving a signal;

a buffering IC having a buffering circuit coupled to the module terminal for buffering the signal wherein the buffering circuit includes a plurality of series-connected buffers and a plurality of series-connected non-volatile elements, wherein each of the series-connected non-volatile elements is coupled in parallel with one of the series-connected buffers; and an IC device coupled to the buffering circuit for receiving a buffered signal.

2. The IC module of claim 1, wherein the module terminal comprises an input/output (I/O) pin.

3. The IC module of claim 2, wherein the I/O pin receives a clock signal.

4. The IC module of claim 1, wherein the series-connected non-volatile elements comprise laser fuses.

5. A Single In-Line Memory Module (SIMM) comprising:

at least one module terminal for receiving a signal;

a buffering IC having at least one buffering circuit coupled to the at least one module terminal for buffering the signal wherein the at least one buffering circuit includes a plurality of series-connected buffers and a plurality of series-connected non-volatile elements, wherein each of the series-connected non-volatile elements is coupled in parallel with one of the series-connected buffers; and a plurality of IC memory devices, each coupled to the at least one buffering circuit for receiving a buffered signal.

6. A Dual In-Line Memory Module (DIMM) comprising:

at least one module terminal for receiving a signal;

a buffering IC having at least one buffering circuit coupled to the at least one module terminal for buffering the signal wherein the at least one buffering circuit includes a plurality of series-connected buffers and a plurality of series-connected non-volatile elements, wherein each of the series-connected non-volatile elements is coupled in parallel with one of the series-connected buffers; and a plurality of IC memory devices, each coupled to the at least one buffering circuit for receiving a buffered signal.

7. A Multi-Chip Module (MCM) comprising:

at least one module terminal for receiving a signal;

a buffering IC having at least one buffering circuit coupled to the at least one module terminal for buffering the signal wherein the at least one buffering circuit includes a plurality of series-connected buffers and a plurality of series-connected non-volatile elements, wherein each of the series-connected non-volatile elements is coupled in parallel with one of the series-connected buffers; and a plurality of IC devices, each coupled to the at least one buffering circuit for receiving a buffered signal.

8. An electronic system comprising an input device, an output device, a memory device, and a processor device coupled to the input, output, and memory devices, at least one of the input, output, memory, and processor devices including an integrated circuit (IC) module comprising:

a module terminal for receiving a signal;

a buffering IC having a buffering circuit coupled to the module terminal for buffering the signal wherein the buffering circuit includes a plurality of series-connected buffers and a plurality of series-connected non-volatile elements, wherein each of the series-connected non-volatile elements is coupled in parallel with one of the series-connected buffers; and an IC device coupled to the buffering circuit for receiving a buffered signal.

9. A method of preparing a signal in an integrated circuit (IC) module for use by an IC device of the IC module, the method comprising:

receiving the signal at the IC module;

providing a buffering IC in the IC module that includes a buffering circuit for buffering the signal;

programming the buffering circuit to buffer the signal in a selected manner;

buffering the signal using the buffering circuit of the buffering IC; and conducting the buffered signal to the IC device.

10. The method of claim 9, wherein said receiving the signal at the IC module comprises receiving the signal at an input/output (I/O) pin of the IC module.

11. The method of claim 9, wherein said programming the buffering circuit comprises programming a plurality of non-volatile elements of the buffering circuit.

12. The method of claim 11, wherein said programming the plurality of non-volatile elements comprises blowing one or more laser fuses of the buffering circuit.

13. The method of claim 9, wherein said buffering the signal comprises:

reducing rise and fall times of edges of the signal;

delaying the signal; and reducing fluctuations in amplitude of the signal.

* * * * *

UNITED STATES PATENT AND TRADEMARK OFFICE
CERTIFICATE OF CORRECTION

PATENT NO. : 6,347,394 B1
DATED : February 12, 2002
INVENTOR(S) : Roland Ochoa and Joe Olson It is certified that error appears in the above-identified patent and that said Letters Patent is hereby corrected as shown below:

Column 2,
Line 34, change "receive" to -- receives --

Signed and Sealed this

Fifteenth Day of February, 2005

JON W. DUDAS
*Director of the United States Patent and Trademark Office*